United States Patent [19]

Tung

[11] Patent Number: 5,728,625
[45] Date of Patent: Mar. 17, 1998

[54] PROCESS FOR DEVICE FABRICATION IN WHICH A THIN LAYER OF COBALT SILICIDE IS FORMED

[75] Inventor: Raymond Tzutse Tung, Warren, Somerset County, N.J.

[73] Assignee: Lucent Technologies Inc., Murray Hill, N.J.

[21] Appl. No.: 627,560

[22] Filed: Apr. 4, 1996

[51] Int. Cl.$^6$ .................... H01L 21/283; H01L 21/336
[52] U.S. Cl. .................... 438/586; 438/649; 438/655
[58] Field of Search .................... 438/586, 649, 438/651, 655, 682, 683

[56] References Cited

U.S. PATENT DOCUMENTS

| | | | |
|---|---|---|---|
| 5,047,367 | 9/1991 | Wei et al. | 437/200 |
| 5,194,405 | 3/1993 | Sumi et al. | 437/200 |
| 5,266,156 | 11/1993 | Nasr | 438/655 |
| 5,290,731 | 3/1994 | Sugano et al. | 437/174 |
| 5,308,793 | 5/1994 | Taguchi | 437/194 |
| 5,397,744 | 3/1995 | Sumi et al. | 437/200 |
| 5,399,526 | 3/1995 | Sumi | 437/190 |
| 5,563,100 | 10/1996 | Matsubara | 438/586 |

OTHER PUBLICATIONS

CoSi$_2$ "An Attractive Alternative to TiSi$_2$ ", by Maex, K., *Semiconductor International*, pp. 75–80, (Mar. 1995).

"New Silicidation Technology by SITOX (Silicidation Through Oxide)", by Sumi, H. et al., IEEE, IEDM Tech Dig., Dec. 1990, pp. 249–252.

"A Manufacturable Process for the Formation of Self Aligned Cobalt Silicide in a Sub Micrometer CMOS Technology", Berti, A.C., *1992 Proc. 9th International VLSI Multilevel Interconnection Conference*(VMIC), pp. 267–273, (Jun. 9–10, 1992).

*Primary Examiner*—T. N. Quach
*Attorney, Agent, or Firm*—Richard J. Botos

[57] ABSTRACT

The present invention is directed to a process for device fabrication in which a layer of cobalt silicide is formed as a low resistance contact layer over the source and drain regions of a device. The silicon substrate is first subjected to conditions that fore a thin layer of oxide on the surface thereof. It is advantageous if the oxide thickness is about 0.5 nm to about 1.5 nm. At least one layer of cobalt is then formed on at least the oxidized surfaces of the silicon substrate. The cobalt layer(s) is formed using conventional expedients such as e-beam evaporation. The cobalt layer(s) is formed on the substrate in an essentially oxygen free environment. Each cobalt layer has a thickness of about 1 nm to about 5 nm. While maintaining the substrate in the essentially oxygen-free environment, the substrate is annealed to form a layer of cobalt silicide. It is advantageous if the substrate is annealed at a temperature in the range of about 450° C. to about 800° C. The cobalt silicide that results has a low resistance and high uniformity that makes it advantageous for use as a contact material.

18 Claims, 4 Drawing Sheets

PRIOR ART

PROCESS FOR DEVICE FABRICATION IN WHICH A THIN LAYER OF COBALT SILICIDE IS FORMED

BACKGROUND OF THE INVENTION

1. Field of the Invention

The present invention is directed to a process for device fabrication in which a layer of cobalt silicide is formed on a semiconductor substrate as a conductive layer.

2. Art Background

In processes for semiconductor device fabrication, silicides, materials formed by the reaction of a refractory metal or a near-noble metal with silicon, are used in a variety of applications. For example, K. Maex, *Materials Sci. Eng.* *R*11, pp. 53–153 (1993) describes using titanium silicide ($TiSi_2$) and cobalt silicide ($CoSi_2$) to lower the sheet resistance of source/drain contacts and gate electrodes. The metal silicides are formed by what is referred to as a self-aligned process, i.e., the metal is applied on the surface of a silicon (Si) wafer with an oxide or nitride pattern thereon and annealed. Only that portion of the metal in contact with exposed single crystal silicon, polycrystalline silicon, or amorphous silicon reacts with the metal to form the silicide. The portion of the metal layer formed over the oxide or nitride mask is not converted to silicide. The metal that is not converted to silicide is easily removed in a subsequent etching step without a masking step. Hence, the process is referred to as self-aligned silicide, or salicide.

In processing ultra-large scale integration (ULSI) silicon metal-oxide-silicon-field-effect transistor (MOSFET) devices with less than one micron design rules, the formation of shallow electrical p-n junction beneath the silicide layer is as important as, if not more important than, the formation of the silicide layer itself. One of two strategies is typically used to form silicided shallow junctions in the source/drain regions. One example, as illustrated in FIGS. 1A through 1C, forms silicide on an existing p-n junction, and is known as post-junction silicidation (PJS). Referring to FIG. 1A, a low dose implantation is first used to form the source and drain extensions, using gate 130 as an implantation mask. An $SiO_2$ layer is then deposited and etched to form the sidewall spacers 170. Arsenic or phosphorous 140 is then implanted into gate 130 and source 110/drain 120 regions of an n-type MOSFET (or, a dose of boron or $BF_2$ is implanted into gate 130, source 110 and drain 120 regions of a p-type MOSFET). An anneal follows to remove the implantation damage and allow the dopants to become electrically active and diffuse to form the shallow p-n junction. A layer 150 of 5–15 nm thick cobalt (Co) is then deposited over the entire wafer, as shown in FIG. 1B. After an anneal of about 450° C. for 10 minutes, CoSi and/or $Co_2Si$ are formed in the heavily-doped source 110, drain 120, and gate 130 regions. Cobalt is mentioned by way of example. Other metals such as titanium, nickel and platinum are also used to form silicides using similar processing techniques. After a selective wet etch removes the unreacted Co from atop field oxide 160 and spacer regions 170, a rapid thermal anneal (RTA) at 700° C. converts CoSi and $Co_2Si$ into $CoSi_2$ 180 as shown in FIG. 1C.

A second strategy forms the junction after silicidation, and is known as silicide-as-doping-source (SADS). After gate and source/drain definition, $CoSi_2$ salicide is formed in gate and source/drain regions by Co sputtering, a first anneal, metal etch, and a second RTA anneal, just as described above for the PJS process. This is followed by an implantation of a dopant species such as arsenic, boron, or phosphorous using an implantation energy which allows most of the implanted dopant atoms to be retained in the $CoSi_2$ layer. During a subsequent anneal at typically 850°–900° C., the implantation damage inside the $CoSi_2$ layer is removed and dopants diffuse into surrounding Si regions to form the p-n junction.

In PJS processing, the uniformity of the silicide layer is important, as variations in the layer thickness have a tendency to weaken or puncture the preformed junction and cause severe leakage. Typically, any native oxide is removed from the surface of Si and polycrystalline Si in order for the silicide layer formed thereon to be uniform. In SADS processing, the uniformity and the thermal stability of the silicide layer are also very important, because the silicide layer needs to remain uniform during the dopant-driving, high-temperature anneal. Polycrystalline $CoSi_2$ layers are known to have non-uniform layer thicknesses. During high temperature anneals, silicide grain boundaries become grooved at the surface and interface. This local thinning leads to agglomeration of the silicide layer during prolonged high-temperature anneals. Because epitaxial layers have a greater uniformity, it is desirable to use epitaxial silicide layers in the source/drain areas, irrespective of whether SADS or PJS is used as the doping scheme. This is because epitaxial silicide layers have no grain boundaries and thus have very high thermal stability. In addition, epitaxial silicide layers can be fabricated with a very smooth interface and excellent layer uniformity. These characteristics of epitaxial silicides make them ideally suited for applications in silicided shallow junction contact and large area diodes/contacts requiring uniform and thin metallic layers.

One known process for growing epitaxial $CoSi_2$ layers is an ultra-high vacuum (UHV) process, using molecular beam epitaxy (MBE), on oxide-free, atomically clean Si(100) and Si(111), and Si(110) surfaces. The presence of oxide on the surface of the silicon retards the MBE epitaxial growth process. Alternatively, epitaxial $CoSi_2$ is fabricated by mesotaxy, using high-energy, high-dose Co implantations. Neither of these two techniques of epitaxial silicide fabrication is compatible with practices in modern semiconductor fabrication lines. A third technique for epitaxial growth of $CoSi_2$ on Si(100) is described in Wei et at, U.S. Pat. No. 5,047,367, wherein a Ti/Co bilayer is deposited on silicon and annealed in nitrogen, leading to the growth of epitaxial $CoSi_2$ at the silicon interface and the formation of TiN near the surface. This technique, which is compatible with conventional silicon processing tools, however, suffers from the generation of large voids in the epitaxial $CoSi_2$ layers near the edges of field oxide and an inability to grow uniform epitaxial $CoSi_2$ layers with thicknesses of less than 40 nm. Since cobalt silicide layers with thicknesses of about 20 nm are desired for smaller design rule devices, a process which can generate thinner (less than 20 nm thick), high-quality, epitaxial $CoSi_2$ layers and which is compatible with conventional processing tools is desired.

Sumi, H. et al., "New Silicidation Technology by SITOX (Silicidation Through Oxide) and Its Impact on Sub-half Micron MOS Devices," *IEDM* Vol. 90, pp. 249–252 (1990) and Sumi et al., U.S. Pat. No. 5,194,405 describe a self-aligned process for device fabrication in which a $TiSi_2$ layer on silicon is formed using a SITOX (Silicidation Through Oxide) technique. In this process, a silicon compound ($SiO_2$) with a thickness of less than 5 nm is first formed on a silicon substrate that typically has a patterned layer or layers of material formed thereover. Titanium self-aligned silicide is then formed using processing steps for Ti silicide formation in the absence of the thin $SiO_2$ layer that are well known to those skilled in the art. These steps include: deposition of 40 nm Ti; a first anneal at 650° C.; selective removal of unreacted Ti and TiN; and a second anneal at 900° C. With the $SiO_2$ layer having a thickness of about 3–5 nm, large grain, uniform, $TiSi_2$ layers result. If the thickness of the $SiO_2$ layer is less than 3 nm, a silicide layer with poor surface morphology results.

One problem with the above-described process is that it is difficult to control the thickness of the oxide layer to the desired degree. Also, the process is only useful for forming thick (i.e. thicknesses of 40 nm or more) titanium silicide, because other metals such as cobalt do not diffuse through the $SiO_2$ layer of the specified thickness to form a silicide layer with the requisite uniformity. Therefore, alternative techniques for forming metal silicides on silicon substrates are desired.

SUMMARY OF THE INVENTION

The present invention is directed to a process for device fabrication in which a thin, uniform, epitaxial layer of cobalt silicide ($CoSi_2$) is formed on a silicon substrate for use in self aligned silicide technology. There is no restriction on the crystal orientation of the silicon substrate. That is silicon substrates of all orientations, e.g., {100}, {110}, {111}, {112}, and {113} and all minor variations away from these pole positions, are contemplated as suitable. The cobalt silicide layer formed according to the present process acts as a stable and highly conductive layer which allows the formation of low-resistance contracts and shallow junctions that result in enhanced device performance.

The process of the present invention is utilized in the context of semiconductor device fabrication. The silicon substrate on which the epitaxial cobalt-silicide is formed will typically have regions of doped and undoped silicon, regions of $SiO_2$ and other regions formed therein. One skilled in the art will appreciate the variety of silicon substrates and the variety of processing contexts in which the process of the present invention can be used. For clarity, the process of the present invention is first described in its most general terms of forming an epitaxial layer of cobalt silicide on an exposed silicon substrate. Specific device structures referred to herein are mentioned by way of example and not by way of limitations.

The silicon substrate is first cleaned using a chemical cleaning process that forms a thin layer of oxide on the source and drain regions of the device. For example, when the substrate is cleaned using an aqueous solution of hydrogen peroxide, a layer of oxide that is about 0.5 nm to about 1.5 nm thick is formed on the exposed silicon surface of the substrate. This process is essentially self-limiting; i.e., after the substrate has been in the solution for a certain amount of time, the rate of oxide formation slows considerably to the point where the amount of oxide subsequently formed is negligible. Typically, the substrate is placed in the solution for about 5 to about 20 minutes in order to form an oxide layer of the desired thickness thereon. It is advantageous if the chemical cleaning solution contains a strong acid, e.g. hydrochloric acid, or a weak base, e.g. ammonium hydroxide. The relative amounts of hydrogen peroxide, water, and other ingredients in these solutions are well known to one skilled in the art and are not discussed in detail herein. It is advantageous if the native oxide is removed from the surface of the substrate using an HF-containing solution prior to this cleaning step.

A layer of cobalt is then formed on the surface of the silicon substrate. The cobalt is formed on the oxide by a technique that grows the cobalt uniformly and relatively free of impurities. These techniques are well known to one skilled in the art. For example, the cobalt is formed on the substrate by e-beam evaporation. It is also contemplated that the cobalt will be formed on the substrate by other techniques such as sputter deposition. The thickness of the cobalt layer is 5 nm or less. It is advantageous if the cobalt layer is about 1 nm to about 4 nm thick.

The cobalt is formed on the substrate in an oxygen-free environment. In the context of the present invention, oxygen-free means that the amount of oxygen in the environment does not adversely affect the growth of the epitaxial cobalt silicide. The environment in which the cobalt layer is formed in the process of the present invention is either a vacuum environment or an inert atmosphere. Argon is one example of a suitable inert atmosphere.

After the cobalt layer is formed, the substrate is annealed to form cobalt silicide ($CoSi_2$) before the cobalt layer is exposed to oxygen. This annealing step is not required if the substrate is maintained at an elevated temperature (i.e. greater than 450° C.) when the cobalt layer is formed on the substrate. It is advantageous if the substrate is annealed at a temperature in the range of about 450° C. to about 800° C. One example of suitable annealing conditions is about 600° C. for about one minute.

The thicknesses of epitaxial $CoSi_2$ layers grown from the deposition of Co layers with the specified thickness range are about 3.6 nm to about 14.4 nm (i.e. the thickness of a layer of $CoSi_2$ is approximately 3.6 times the thickness of the cobalt layer from which it is formed). If thicker epitaxial $CoSi_2$ layers are desired, various techniques for increasing the thickness of a "template" layer, such as those described in U.S. Pat. No. 4,477,308 to Gibson et al., are contemplated as useful for increasing the thickness.

For example, a 2 nm thick cobalt layer is deposited by e-beam evaporation or sputtering in an essentially oxygen-free environment onto a thin epitaxial $CoSi_2$ layer formed as previously described. The substrate temperature during this second Co deposition is kept at less than 650° C. After the Co deposition, the substrate is annealed at typically 650° C. for 1 minute before exposure to any oxygen-containing environment. As a result of this second processing cycle, the thickness of the epitaxial $CoSi_2$ layer is increased by about 7.2 nm. If still thicker $CoSi_2$ layers are desired, the deposition and anneal steps are repeated as many times as it takes to reach the desired thickness of the $CoSi_2$ layer. It is advantageous to complete all depositions and anneals without a break of vacuum. However, after each annealing step, removing the sample from the vacuum chamber and exposure to air does not adversely affect the subsequent growth processes. When the $CoSi_2$ layer has been grown with the desired thickness, it is advantageous to give the wafer a high temperature (about 750° C. to about 950° C.) anneal for about one to about ten minutes to improve the crystallinity of the silicide layer and to planarize the $CoSi_2$/Si interface. It is advantageous if this high temperature anneal is performed in an oxygen-free, nitrogen-containing environment.

Silicide layers generated by the present process can be used in the source-drain regions of a MOSFET, as contacts to bipolar transistor electrodes, as low resistivity contacts to $Si_{1-x}Ge_x$ devices, as large area Schottky diodes/optical detectors, and as a contact bottom fill material.

DETAILED DESCRIPTION OF THE PRESENT INVENTION

The present invention is directed to a process for forming an epitaxial quality cobalt silicide ($CoSi_2$) layer for use in self aligned silicon technology. The process is incorporated into processes for device fabrication in which a layer of cobalt silicide is desired. Examples of processes in which the present invention is incorporated include processes in which an epitaxial $CoSi_2$ layer in heavily-doped diffused regions of a Si MOSFET device is desired and processes that use a $CoSi_2$ layer as a diffusion source.

Figure 1A:
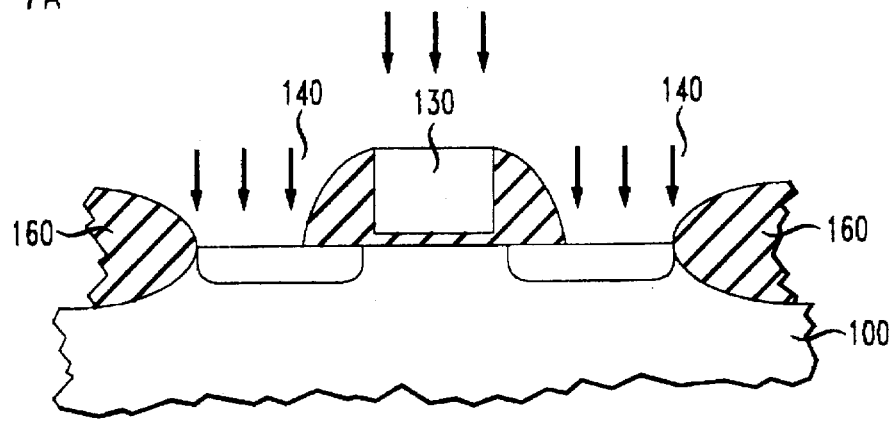
FIGS. 1A–1C illustrate a prior art self-aligned cobalt silicide processing sequence by cross-sectional elevation view of a silicon substrate with a layer of thin oxide and a layer of cobalt silicide formed thereon.
Figure 1B:
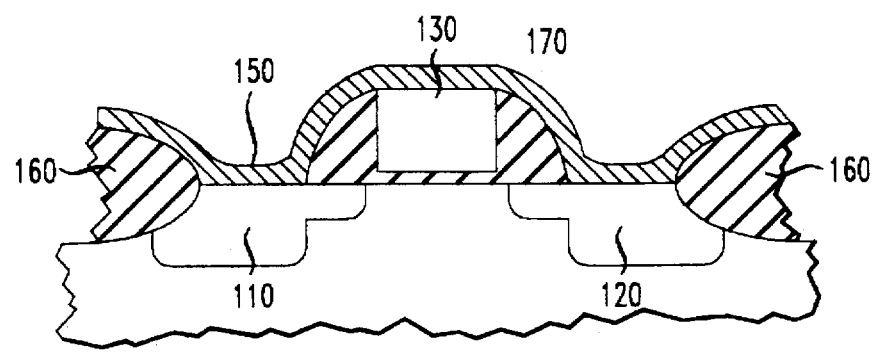
Figure 1C:
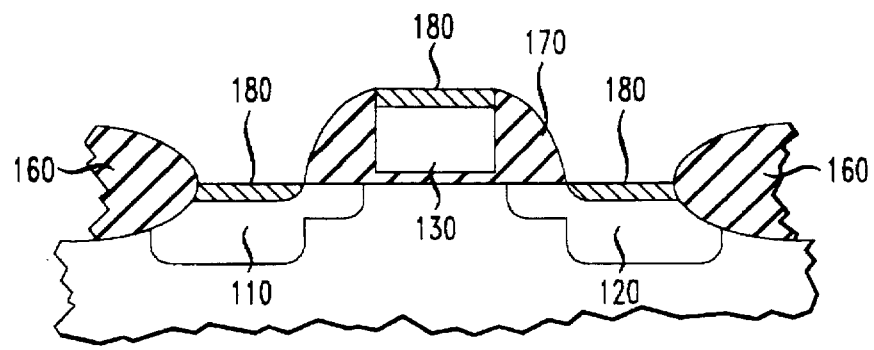
Figure 2A:
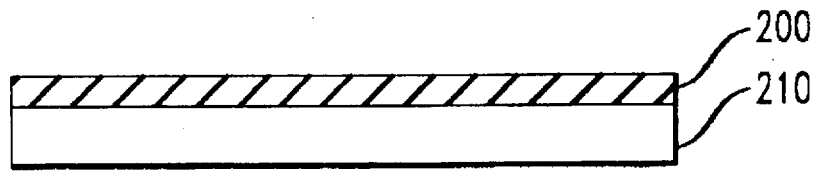
FIGS. 2A–2C illustrate schematically the cobalt silicide processing sequence of the present invention by cross-sectional elevation view of a silicon substrate with a layer of thin oxide and a layer of cobalt silicide formed thereon.
Figure 2B:
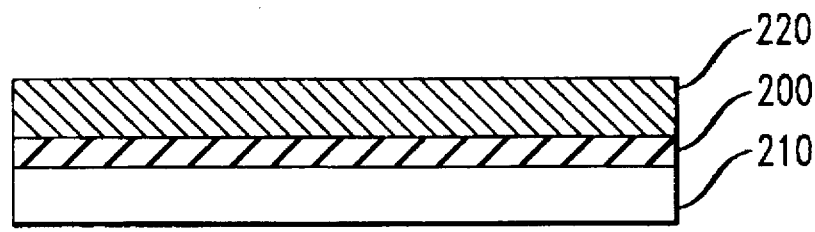
Figure 2C:
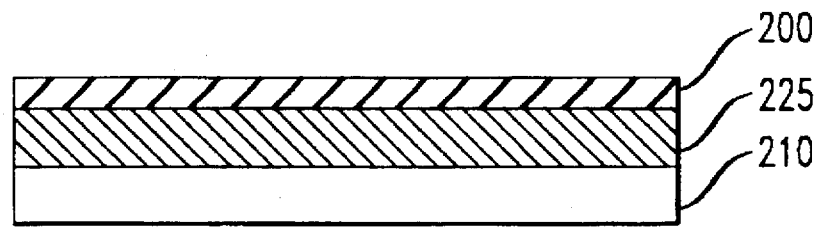

The process is first described in terms of forming a layer of $CoSi_2$ on a silicon substrate. FIGS. 2A–2C are a schematic illustration of a cross-section of a silicon substrate on which a layer of $CoSi_2$ is formed according to the process of the present invention. In the process of the present invention, a thin layer (i.e. a thickness of 0.5 to about 1.5 nm or less) of oxide 200 is formed on the surface of a silicon substrate 210. This oxide layer 200 is formed by conventional methods such as by subjecting the substrate to a chemical cleaning solution known to form oxide on exposed silicon surfaces. These chemical solutions typically contain hydrogen peroxide and water. Examples of suitable solutions include solutions of hot (e.g., about 100° C.) hydrochloric acid (HCl) and hydrogen peroxide ($H_2O_2$) in water (a 3:1:1 by volume solution) and hot (e.g., about 90° C.) ammonium hydroxide ($NH_4OH$) and $H_2O_2$ in water (a 1:1:4 by volume solution). Typically, the substrate is submerged in the solution for about 5 to about 20 minutes. Another example of a suitable method for growing the oxide layer is annealing the silicon substrate in a dry oxygen atmosphere under conditions sufficient to grow an oxide layer with a maximum thickness of about 1.5 nm. One example of suitable conditions is an anneal at 810° C. in pure oxygen for about 4 minutes.

After the oxide layer 200 is formed, the wafer is placed in an environment that is essentially oxygen-free. In the context of the present invention, oxygen is excluded from the environment to prevent the cobalt from oxidizing to a significant degree during the subsequent annealing steps. Suitable environments include vacuum environments and inert atmospheres such as Argon.

Referring to FIG. 2B, the substrates are then subjected to conditions for forming a layer of cobalt 220 on the surface of the substrate 210. The cobalt layer 220 is formed over the oxide layer 200. The conditions are selected so that the cobalt layer has a uniform thickness. The cobalt layer 220 is formed on the surface of the substrate using conventional techniques such as e-beam evaporation or sputter deposition. It is advantageous if e-beam evaporation is used to form the cobalt on the surface of the substrate because the resulting cobalt layer is uniform and relatively free of impurities. In the context of the present invention, the thickness of the cobalt layer is greater than 1 nm and does not exceed about 5 nm. In order to obtain the desired layer uniformity, it is advantageous if the thickness of the cobalt is less than 4 nm. The resulting $CoSi_2$ layers formed by the process of the present invention are observed to be inhomogeneous if the cobalt layers formed on the substrate are not within the prescribed thickness range.

After the cobalt layer 220 is formed on the substrate, the substrate is then annealed. The substrate is kept in an essentially oxygen free environment until after the annealing step. The temperature at which the substrate is annealed is largely a matter of design choice. However, it is advantageous if the temperature is between about 450° C. and about 800° C. The substrate is annealed for an amount of time that is sufficient to convert the cobalt to cobalt silicide. The amount of time is a function of the thickness of the cobalt layer and the temperature at which the anneal takes place. For example, a 30 second anneal is sufficient to convert a 2 nm-thick layer of cobalt to cobalt silicide at 600° C. At higher temperatures or for a thinner layer, less time would be required and at lower temperatures or for a thicker layer, more time would be required. Although not illustrated in FIG. 2C, the portions of the cobalt layer that are not converted to $CoSi_2$ are removed from the substrate at this point in the process.

As illustrated in FIG. 2C, after this annealing step, cobalt silicide 225 is formed directly over the silicon substrate 210 and the oxide layer 200 then overlies the cobalt silicide layer 225. Since the thickness of the cobalt layer formed on the substrate has a thickness of about 1 nm to about 5 nm, the thickness of the resulting, fully reacted, $CoSi_2$ layer is about 3.6 nm to about 18 nm. In certain instances, $CoSi_2$ layers with a thickness greater than about 18 nm is desired. Thicker $CoSi_2$ layers are formed by repeating the process sequence described above, i.e., a layer of cobalt is formed on the surface of the substrate and annealed to form $CoSi_2$ while the substrate is maintained in an essentially oxygen-free environment. When forming a $CoSi_2$ layer using more than one cobalt-formation/anneal cycle, it is advantageous if the substrate is maintained in an essentially oxygen-free environment until the entire $CoSi_2$ layer is formed. These subsequent layers of cobalt are not limited in thickness in the same manner as the initial cobalt layer. However, it is advantageous if the thickness of the subsequent cobalt layers does not exceed about one-third the thickness of the underlying cobalt silicide. This limitation on the thickness of the cobalt layers is to prevent the renucleation of $CoSi_2$ in subsequent silicide reactions. This thickness limitation on the subsequent layers of cobalt formed over the initial cobalt silicide layer ensures that the amount of existing $CoSi_2$ is adequate to accommodate the $Co_2Si$ and $CoSi$ reactions with the subsequent cobalt layer.

Figure 3A:
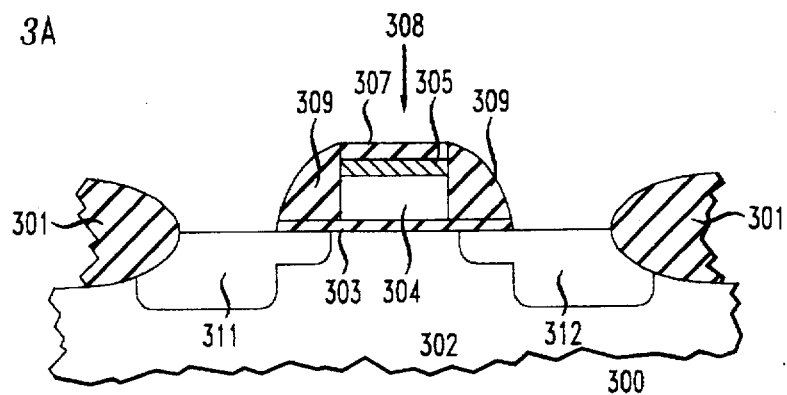
FIGS. 3A–3D illustrate an embodiment of the present invention in which the self-aligned cobalt silicide processing sequence of the present invention is used in the fabrication of an n-MOSFET device.

The above described process is further described as it is used in a conventional process for fabricating an n-MOSFET device. One skilled in the art will appreciate how to incorporate the process of the present invention into a process for device fabrication to form $CoSi_2$ at the desired point in the processing sequence. Referring to FIG. 3A, a field insulating film 301, such as $SiO_2$, is selectively formed on portions of a lightly doped p-type Si substrate 302, for isolation between various elements. Then, a gate electrode 308 is formed. The gate electrode 308, is formed using conventional processing techniques.

For example, a gate insulating film 303, such as a thermally grown $SiO_2$ film, is formed on the surface of active regions between the field insulating portions 301. Next a polycrystalline silicon film 304 is formed on the surface of the gate insulating film by a CVD (chemical vapor deposition) process, after which a $WSi_x$ layer 305 is sputtered on top of the polycrystalline Si layer 304. An n-type dopant such as As, is then implanted into the $WSi_x$ layer 305 and the upper part of the polycrystalline silicon (Si) layer 304. A hard mask layer 307, such as an $SiO_2$ layer, is then deposited on the $WSi_x$ layer and the stack of hard mask 307, $WSi_x$ layer 305 and the polycrystalline Si layer 304 is then etched in a desired pattern to form the gate electrode 308 atop the gate insulating film 303 depicted in FIG. 3A.

Conventionally, n-type impurities, As for example, are then implanted at low concentration into the Si substrate, with the gate electrode 308 acting as a mask, after which a further $SiO_2$ film 309 is deposited over the gate electrode 304 and the gate insulating film 303. This $SiO_2$ film 309 is anisotropically etched vertically and horizontally relative to the substrate 302 by a reactive ion etching (RIE) process to form the side wall spacers 309 on the sides of the gate electrode 304.

Then n-type impurities such as arsenic (As) are implanted at high concentration into the silicon substrate 301 with the gate electrode 308 and the side wall spacers 309 acting as a mask. The device is then annealed to electrically activate the implanted impurities and hence dope the polycrystalline silicon 304 and form the shallow junctions in the source 311 and drain 312 region with lightly doped extensions.

Figure 3B:
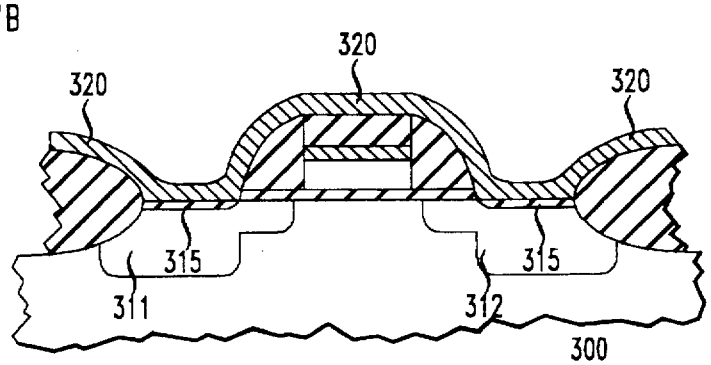

Referring to FIG. 3B, in order to form the desired layer of $CoSi_2$ on the exposed silicon surfaces of this structure, a dilute, HF-containing, aqueous solution is then used to remove any native oxide on the surface of the source 311 and drain 312 regions and any of the gate insulating film 303 that remains in the source 311 and drain 312 regions. Small portions of the side wall and the hard mask material are also removed during the HF etch. The wafer is then immersed in a 1:1:4 solution of $H_2O_2:NH_4OH:H_2O$ at 90° C. for 15 minutes to grow a thin $SiO_x$ layer 315 in the heavily-doped source 311 and drain 312 areas. The wafer 300 is then loaded in a sputtering chamber with a low background (e.g., less than about $5 \times 10^{-9}$ torr) of oxygen, water vapor, and hydrocarbon partial pressures. A uniform layer of high-purity cobalt 320, 2.5 nm thick, is then sputtered at a low deposition rate (less than about 0.5 nm/s) while the wafer is maintained at 300° C.

Figure 3C:
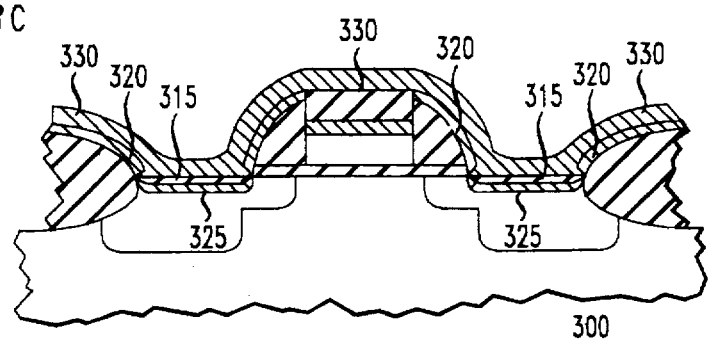
Figure 3D:
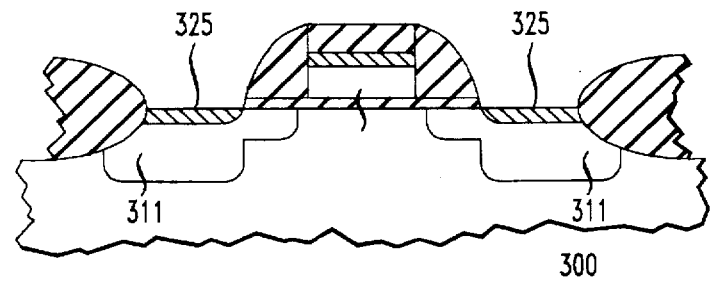

Referring to FIG. 3C, this cobalt layer 320 is annealed in the oxygen-free sputtering chamber at 650° C. for 2 minutes which leads to the growth of an epitaxial $CoSi_2$ layer 325 on top of the source 311 and drain 312 regions. A second uniform layer of cobalt 330, 2 nm thick, is then sputtered while the substrate is held at less than 300° C., resulting in the structure depicted in FIG. 3C. A second anneal in the essentially oxygen-free sputtering chamber at 700° C. for 1 minute follows, which increases the thickness of the epitaxial $CoSi_2$ layer 325. A wet etch is then used to remove unreacted cobalt (320 and 330) from atop the field oxide, the hard mask and the side walls. The wafer is annealed at 850° C. for 1 minute in a nitrogen ambient. During this anneal, the $SiO_x$ layer 315 evaporates and/or agglomerates. The resulting structure is depicted in FIG. 3D, which illustrates that the cobalt silicide 325 remains in the source and drain regions of the substrate 302. The epitaxial $CoSi_2$ formed in the source and drain regions has a thickness of about 16 nm.

Referring to FIGS. 4A–D, in another embodiment of the present invention, the technique of silicide as doping source (SADS) is used to form the shallow junction. A field insulating film 401, such as $SiO_2$ is selectively formed on portions of a lightly doped p-type Si substrate 402, for isolation between various elements. Then, a gate insulating film 403, such as a thermally grown $SiO_2$ film is formed on the surface of an active region between the field insulating portions 401. Next, a polycrystalline silicon film 404 is formed on the surface of the gate insulating film 403 by a CVD (chemical vapor deposition) process, after which a $WSi_x$ layer 405 is sputtered on top of the polycrystalline Si layer 404. An n-type dopant 406, such as As, is then implanted into the $WSi_x$ layer 405 and the upper part of the polycrystalline Si layer 404. A hard mask layer 407, typically $SiO_2$, is then formed on top of the $WSi_2$ layer. The stack containing the hard mask 407, the $WSi_x$ layer 405, and the polycrystalline Si layer 404 is then etched in a desired pattern to form the gate electrode 408 atop the gate insulating film 403.

Figure 4A:
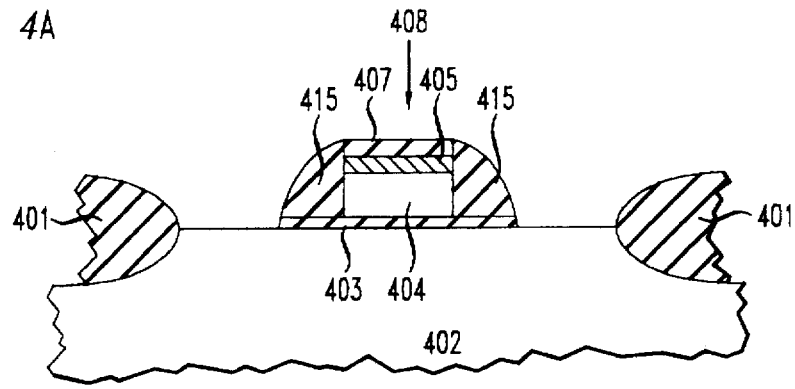
FIGS. 4A–4D illustrate an embodiment of the present invention in which the self-aligned cobalt silicide processing sequence of the present invention is used in the fabrication of an n-MOSFET device in which the cobalt silicide is used as a doping source.

An $SiO_2$ film 415 is deposited over the gate electrode 408 and the gate insulating film 403. This $SiO_2$ film 415 is subjected to anisotropic etching vertically and horizontally relative to the substrate 401 by a reactive ion etching (RIE) process to form the side wall spacers 415 on the sides of the gate electrode 408 as shown in FIG. 4A.

Figure 4B:
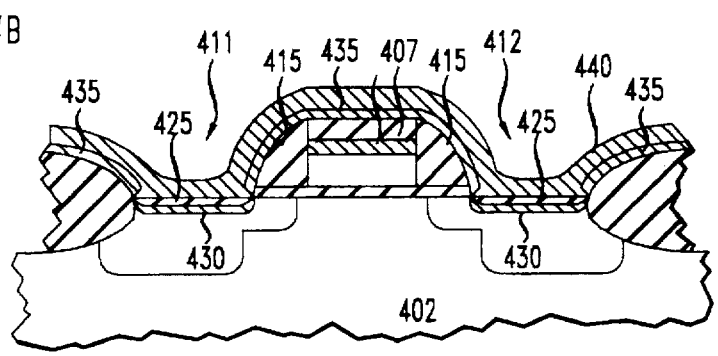

Referring to FIG. 4B, in order to form the desired epitaxial $CoSi_2$ layer on the exposed portions of this device, a dilute, HF-containing, aqueous solution is first used to remove the gate insulating film 403 and the native oxide over the source 411 and drain 412 regions. Small portions of the side wall 415 and the hard mask 407 are also removed during the HF etch. The wafer is then immersed in a 1:3:1 solution of $H_2O_2:HCl:H_2O$ solution at about 100° C. for 5 minutes to grow a thin $SiO_x$ layer 425 in the source 411 and drain 412 areas. The wafer is then loaded in a ultra-high vacuum evaporation chamber with low background oxygen, water vapor, and hydrocarbon partial pressures less than about $1 \times 10^{-10}$ torr. A uniform layer of high purity cobalt 435, 2.5 nm thick, is e-beam deposited at a low deposition rate (i.e. less than 0.5 nm/s) while the substrate is held at room temperature. The substrate with cobalt layer 435 formed thereon is annealed in an ultra high vacuum (UHV) evaporation chamber at 600° C. for 2 minutes, leading to the growth of epitaxial $CoSi_2$ layer 430 in the source 411 and drain 412 regions. The portion of the cobalt layer 435 on top of the field insulating layer 401, the spacer 415, and the hard mask 407 does not react to form cobalt silicide as indicated in FIG. 4B by the fact that the cobalt 435 remains on top of the substrate in these regions.

Figure 4C:
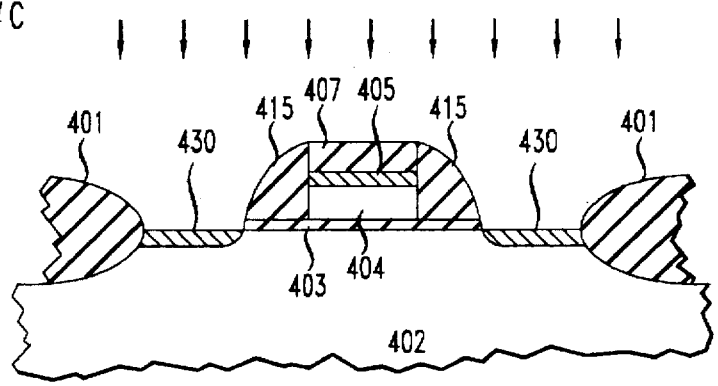
Figure 4D:
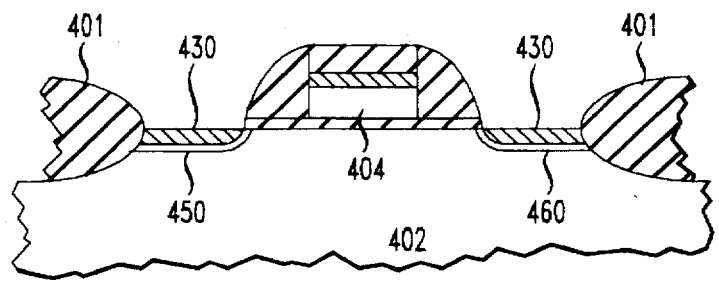

A second uniform layer of cobalt 440, 2 nm thick, is then e-beam deposited while the wafer is held at a temperature less than 300° C. A second anneal in the UHV evaporation chamber at 700° C. for 1 minute follows. After unreacted cobalt is removed from atop the field oxide 401, the hard mask 407 and the side walls 415 through a wet etching, the wafer is annealed at 850° C. for 1 minute in a nitrogen ambient. The thin $SiO_2$ layer 425 either dissolves or agglomerates during this anneal. Then n-type impurities such as arsenic (As) are implanted at high concentration into the epitaxial $CoSi_2$ layer 430 as shown in FIG. 4C. The substrate is annealed at about 900° C. for 5 minutes to allow arsenic to diffuse out of the $CoSi_2$ layers and into the single crystal Si area immediately surrounding the $CoSi_2$ layer and form heavily doped $n^+$ regions 450 and 460, as illustrated in FIG. 4D. Also as a result of this anneal, n-type dopants diffuse into the polycrystalline Si layer 404.

EXAMPLE

A variety of silicon substrates were obtained. These substrates were Si(100), Si(110), Si(111), Si(511), Si(211), 4°-misoriented Si(100) substrates, Si(100) substrates implanted with arsenic (As) dopants, Si(100) substrates implanted with boron ($BF_2$) dopants, and oxide patterned Si(100) substrates. The As-implanted substrates had a dose of $3 \times 10^{15}$ cm$^{-2}$ at an implant energy of 70 keV. The $BF_2$-implanted substrates had a dose of $3 \times 10^{15}$ cm$^{-2}$ at an implant energy of 40 keV. The implanted wafers were annealed at 1000° C. for 10 seconds in nitrogen after the implant.

The substrates were then subjected to one of two methods for growing a thin oxide layer on the surface of the substrate. The first method was by immersing a wafer in a hot solution of $HCl:H_2O_2:H_2O$ (3:1:1 solution) for 5 minutes. The second method was by immersing a wafer in a hot solution of $NH_4OH:H_2O_2:H_2O$ (1:1:4 solution) for 20 minutes. An oxide layer with a thickness of about 0.5 to about 1.5 nm was formed on the various substrates using the above-described methods.

The substrates were then placed in a UHV system with a base pressure of $6 \times 10^{-11}$ torr and equipped with an electron beam evaporator. Cobalt was evaporated on the unheated substrates to a thickness of 2 nm at a deposition rate of 0.05 nm/sec. The chamber pressure was maintained below $2 \times 10^{-10}$ torr during evaporation. Substrates were then annealed in the evaporation chamber at 650° C. for two minutes. A second layer of Co, 1.5 nm thick, was then evaporated onto the unheated substrates at the same rate of 0.05 nm/sec. The substrates were then annealed at 650° C. for two minutes.

A third layer of Co, 3 nm thick, was then evaporated onto the unheated substrates, using the previously described conditions. The substrates were then annealed at 700° C. for one minute. The substrates were then removed from the vacuum chamber and immersed in a selective Co etch (a 16:1:1:2 solution of phosphoric acid, nitric acid, acetic acid and water, by volume, respectively, was used) at room temperature for two minutes. After the substrates were rinsed in deionized water and dried, the substrates were annealed at 850° C. for one minute in nitrogen. The thickness of the uniform, epitaxial $CoSi_2$ layer on the substrates was about 23 nm.

What is claimed is:

1. A process for device fabrication comprising:
   forming a layer of oxide with a thickness of about 0.5 nm to about 1.5 nm on the surface of a silicon substrate;
   placing the substrate in an essentially oxygen-free environment;
   forming at least one layer of cobalt with a thickness of about 5 nm or less on the substrate while maintaining the substrate in an essentially oxygen free environment; and
   heating the substrate under conditions sufficient to form an epitaxial layer of cobalt silicide on the silicon substrate.

2. The process of claim 1 wherein the substrate is heated to a temperature greater than 450° C.

3. The process of claim 2 wherein the substrate is heated to a temperature of about 450° C. to about 800° C.

4. The process of claim 1 wherein the oxide is formed by contacting a surface of the substrate with a solution comprising hydrogen peroxide and water.

5. The process of claim 4 wherein the solution further comprises a third component selected from the group consisting of a strong acid and a weak base.

6. The process of claim 5 wherein the strong acid is hydrochloric acid and the weak base is ammonium hydroxide.

7. The process of claim 1 wherein the oxide is deposited on the substrate.

8. The process of claim 1 wherein the oxide is formed by thermal oxidation.

9. The process of claim 1 further comprising forming an additional thickness of cobalt silicide by forming at least one additional layer of cobalt on the substrate with the cobalt silicide formed thereon and annealing the substrate while maintaining the substrate in an essentially oxygen free environment.

10. The process of claim 9 wherein the thickness of the additional layer of cobalt does not exceed about one-third of the thickness of the cobalt silicide formed on the silicon substrate.

11. The process of claim 1 wherein the thickness of the cobalt is about 1 nm to about 4 nm.

12. The process of claim 1 wherein the cobalt is formed by sputtering.

13. The process of claim 1 wherein the cobalt is formed by electron beam evaporation.

14. The process of claim 11 wherein the cobalt is formed by chemical vapor deposition.

15. The process of claim 1 wherein the silicon substrate has at least one source region, at least one drain region, at least one gate region and at least one field oxide region formed thereon prior to the formation of the cobalt layer over the substrate, the process further comprising removing the cobalt remaining on the substrate after the heating step.

16. The process of claim 15 wherein the gate region of the substrate has a gate electrode formed thereover comprising layers of silicon dioxide, doped polysilicon, metal silicide, and a silicon dioxide film formed thereover, wherein the process further comprises introducing a dopant into the cobalt silicide layer and subjecting the substrate to conditions that promote the diffusion of the dopant from the cobalt silicide into the surrounding silicon.

17. The process of claim 16 wherein the dopant introduced into the cobalt silicide is arsenic.

18. The process of claim 17 wherein the substrate is subjected to temperature in excess of about 800° C. to cause the dopant to diffuse from the cobalt silicide into the surrounding silicon.

* * * * *